United States Patent [19]

Endoh et al.

[11] Patent Number: 4,668,314
[45] Date of Patent: May 26, 1987

[54] METHOD OF MANUFACTURING A SMALL ELECTRONIC DEVICE

[75] Inventors: Kenji Endoh, Iruma; Fumio Narui, Tokyo; Kazuhiro Sugiyama, Tokyo; Kazuya Hara, Tokyo; Tatsuo Shimazaki, Tokyo, all of Japan

[73] Assignee: Casio Computer Co., Ltd., Tokyo, Japan

[21] Appl. No.: 601,030

[22] Filed: Apr. 16, 1984

[30] Foreign Application Priority Data

Oct. 25, 1983 [JP] Japan ................................. 58-199633
Nov. 21, 1983 [JP] Japan ................................. 58-219078
Nov. 21, 1983 [JP] Japan ................................. 58-219079

[51] Int. Cl.⁴ ............................................. B65H 7/02
[52] U.S. Cl. ........................................ 156/64; 29/832;
29/841; 156/267; 156/269; 156/272.8; 156/291;
219/121 LJ; 235/61 A; 339/17 B; 428/1;
428/203; 445/25
[58] Field of Search ................... 29/832, 841; 156/291,
156/64, 267, 269, 272.8; 219/121 LG, 121 LJ;
235/61 A, 61 R; 339/17 B, 17 C; 364/700, 708;
428/1, 203; 445/25

[56] References Cited

U.S. PATENT DOCUMENTS 4,216,577 8/1980 Badet et al. ..................... 29/841 X
4,374,314 2/1983 Deacutis ........................ 219/121 LJ
4,474,839 10/1984 Takamatsu et al. .................... 428/1

Primary Examiner—Robert A. Dawson
Attorney, Agent, or Firm—Frishauf, Holtz, Goodman & Woodward

[57] ABSTRACT

A method of manufacturing a small electronic device includes intermittently feeding predetermined length of a base film, which forms a film strip; arranging electronic elements, e.g., a film-like liquid crystal display cell, a film-like solar cell and a printed circuit board, on a predetermined region of the film strip; arranging a frame on the film strip, so that the frame surrounds the electronic elements; depositing an adhesive onto the film strip; placing a panel on the film strip; moving press means on the panel from one end of the panel to the other end thereof, thereby pressing the panel and bonding the same to the film strip; and cutting the film, thereby forming a semifinished product. This method further includes detecting the position of the periphery of the semifinished product and trimming unfinished portions with a laser beam, thereby forming a finished product of a prescribed shape and size.

16 Claims, 42 Drawing Figures

F I G. 2
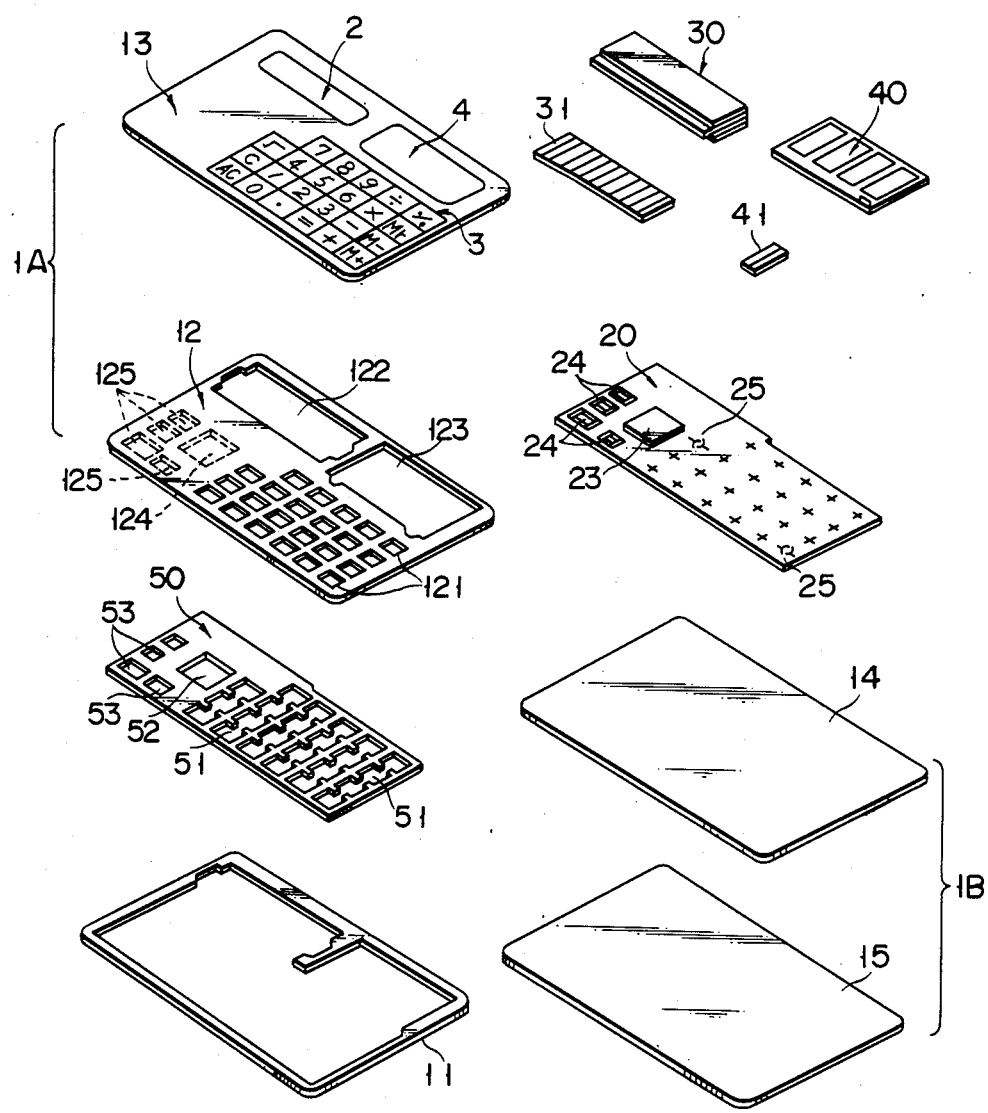

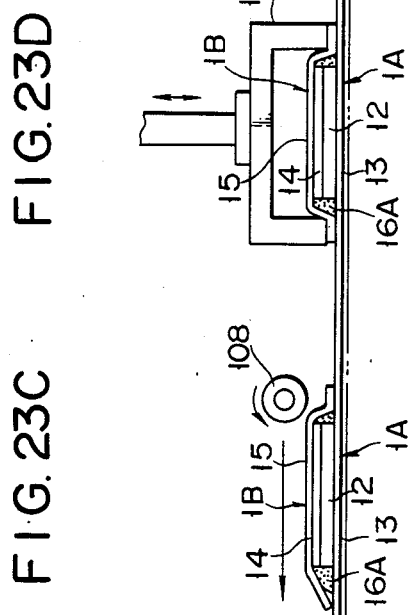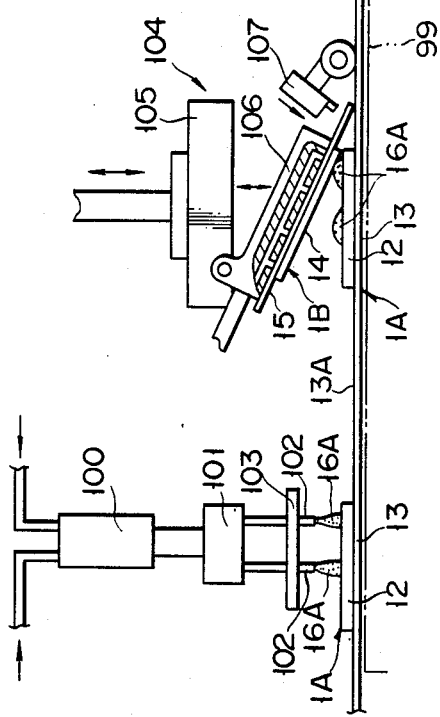

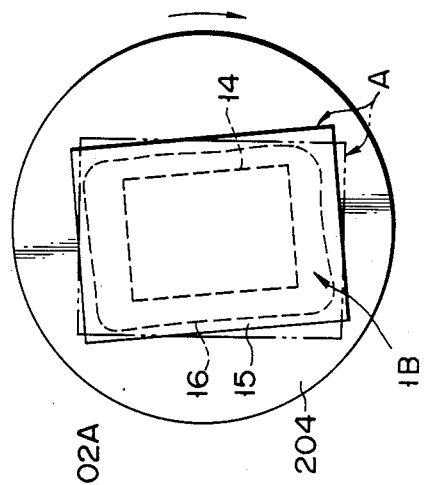
FIG. 26A
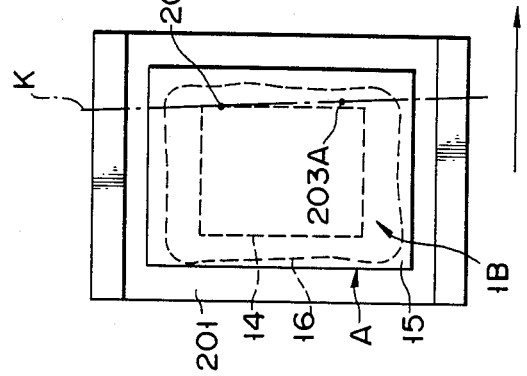
FIG. 26B
FIG. 26C

METHOD OF MANUFACTURING A SMALL ELECTRONIC DEVICE

BACKGROUND OF THE INVENTION

The present invention relates to a method of manufacturing a small electronic device.

The electronic parts (e.g., the liquid crystal display, solar cell, printed circuit board) of a small electronic device (e.g., a pocket calculator) are arranged within a case frame. The case frame comprises a front plate and a back plate. These plates are fastened together by screws.

Recently, a very thin pocket calculator called "a card calculator," has been made and commonly used. Its thickness is approximately 2 mm. This is because a front plate and a back plate must be thick so that screw holes may be deep enough to fasten them together by screws. Hence, it is considered extremely difficult to manufacture a thinner card calculator.

SUMMARY OF THE INVENTION

Accordingly, the primary object of the invention is to provide a method of manufacturing a small, very thin electronic device.

A second object of the invention is to provide a method of manufacturing a small electronic device which is not deformed in spite of the adhesive used to fasten the parts of the device.

A third object of this invention is to povide a method of manufacturing a small electronic device of a shape which precisely accords with design.

According to the present invention there is provided a method of manufacturing a small electronic device, which comprises a first step of intermittently feeding a base film, each time a predetermined length thereof, a second step of arranging at least one film-like electronic element on the predetermined length of the base film, a third step of securing at least the edge portions of a panel sheet to that surface of the base film on which the electronic element is arranged, thereby sealing the electronic element between the base film and panel sheet, and a fourth step of cutting the base film, thereby separating the predetermined length of the base film of a predetermined shape with the panel sheet and electronic element. Hence, the device thus made can be thinner than the known devices whose parts have been fastened by screws.

Further, according to the invention there is provided a method of manufacturing a small electronic device, comprising a first step of attaching at least one film-like electronic part to one surface of a first film-like member, a second step of dribbling an adhesive onto said surface of the first film-like member, a third step of placing a second film-like member above the first film-like member which has drops of adhesive on it, and a fourth step of pressing the second film-like member by a press means moving from one end of the second film-like member to the other end thereof, thereby bonding the first and second film-like members together. With this method, the adhesive can wet the entire surface of the first film-like member and hence fills up the gap between the first and second film-like members. Since the second member is pressed onto the first, neither member will wrinkle or wave.

Still further, according to the present invention there is provided a method of manufacturing a small electronic device, comprising a first step of preparing a semifinished product by making a casing comprising a frame substantially defining the shape and size of a finished product, film-like electronic elements provided within the frame and a panel supporting the frame and film-like electronic elements, said frame and/or panel being made of metal, by laminating two pieces of plastic film, which are larger than the casing, on the upper and lower surfaces of the casing, respectively, and by filling an adhesive in the groove defined by the plastic strips and the outer periphery of the casing, a second step of detecting the position of the periphery of the frame or panel which is made of metal, a third step of moving the semifinished product to a position where a laser beam is applied to trim the unfinished product, and a fourth step of trimming the plastic strips and the cured adhesive layer on the periphery of the casing. Therefore, a hard adhesive layer of a uniform thickness will be formed over the edges of the metal member.

BRIEF DESCRIPTION OF THE DRAWINGS

FIG. 2 is an exploded view of the card calculator shown in FIG. 1;

FIGS. 23A–23D are front views of a base film, showing how an adhesive is deposited onto the base film and how a back panel is pressed onto the base film;

FIGS. 26A–26C are enlarged plan views of the unfinished product shown in FIG. 25;

DETAILED DESCRIPTION OF THE PREFERRED EMBODIMENTS

A small electronic device manufactured by the method according to the present invention, e.g., a card calculator, will be described first.

Figure 1:
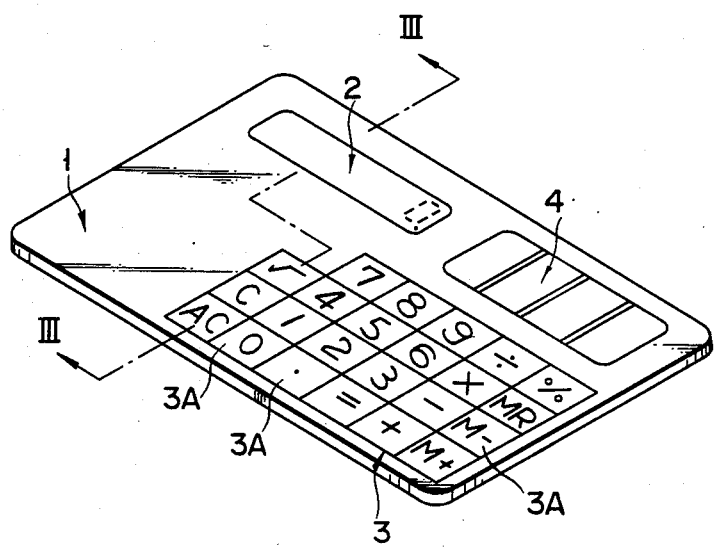
FIG. 1 is a perspective view of a card calculator manufactured by the method according to the present invention.
Figure 3:
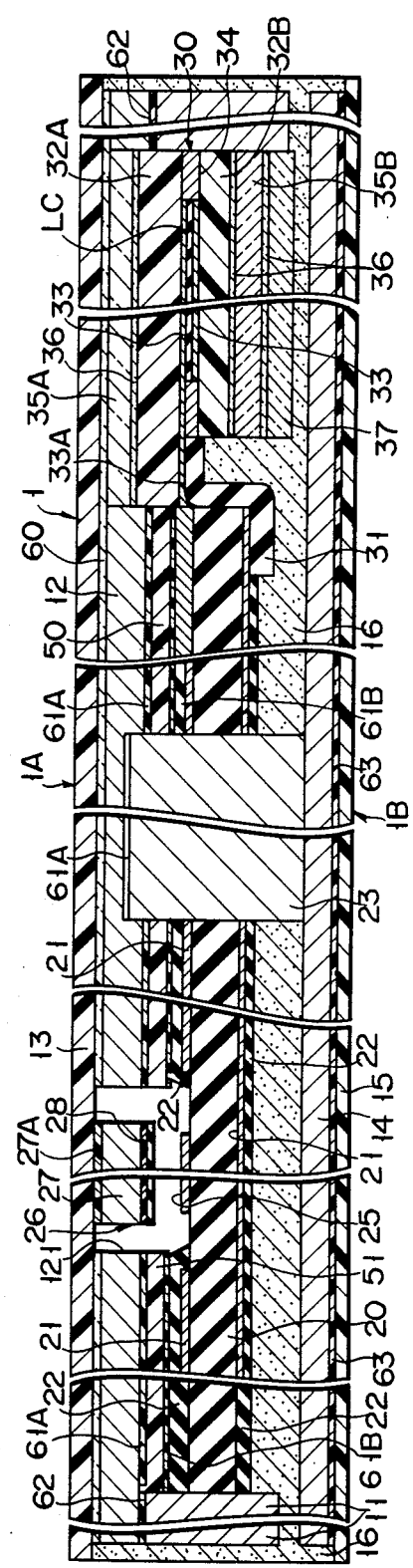
FIG. 3 is an enlarged, cross sectional view of the calculator, taken along line III—III in FIG. 1.

FIG. 1 schematically shows a card calculator. The calculator comprises a rectangular casing 1, a display section 2, a keyboard section 3 and a solar cell section 4. As shown in FIGS. 2 and 3, the calculator has thin, flat parts which are mounted one upon another. The casing 1 comprises a frame 11, a front sheet 12, a front film 13, a back sheet 14, and a back film 15. The sheet 12 and film 13 form a front panel 1A, and the sheet 14 and film 15 form a back panel 1B.

As shown in FIG. 3, within the casing 1 there are arranged a printed circuit board 20, a film-like LC (liquid crystal) display cell 30 and a film-like solar cell 40. The board 20 consists of a synthetic resin film, a circuit pattern 21 printed on both surfaces of the resin film and two insulation layers 22 formed on the surfaces of the resin film. A spacer 50 made of a synthetic resin and having substantially the same size as the board 20 is secured to the upper surface of the board 20.

The printed circuit board 20 has holes. In these holes, an LSI chip 23 and electronic elements 24 such as capacitors and diodes are fitted. Many stationary contacts 25 are arranged on the upper surface of the printed circuit board 20, in rows and columns. These contacts 25 may be connected by a movable contact (later described).

The spacer 50 has a number of openings 51 in which the stationary contacts 25 are located. The spacer 50 has an opening 52 and openings 53. That portion of the LSI chip 23 which protrudes from the board 20 is placed in the opening 52, and those portions of electronic elements 24 which protrude from the board 20 are positioned in the openings 53.

The printed circuit board 20, LC display cell 30 and solar cell 40 are placed within the frame 11, which is formed by stamping a thin metal plate, e.g., stainless steel plate and serves as a reinforcement. The display cell 30 is connected to the board 20 by a flexible connector 31, which has a plurality of terminals fixed by a hot melt adhesive. The solar cell 40 is also connected to the board 20 by a similar flexible connector 41.

The film-like LC cell 30 is a TN (twisted nematic) type. As shown in FIG. 3, it comprises two transparent layers 32A and 32B, a seal member 34, transparent display electrodes 33, orientation films (not shown), two polarization layers 35A and 35B, and a reflector plate 37. The transparent layers 32A and 32B are made of a synthetic resin, e.g., polysulfone. The transparent layers 32A and 32B are adhered to each other in the periphery by the seal member 34, thus being arranged so as to contain the liquid crystal (LC). In this space, the electrodes 33 are laid on the transparent layers 32A and 32B, and the orientation films are placed on the electrodes 33. The polarization layers 35A and 35B are bonded to the outer surfaces of the transparent layers 32A and 32B with a transparent adhesive 36. The reflector plate 37 is attached to the lower surface of the polarization layer 35B by hot-press. The terminals of flexible connector 31 are positioned to face the terminals of the electrode 33. The LC display cell 30 is 550 microns (approx. 0.55 mm) thick.

Figure 4:
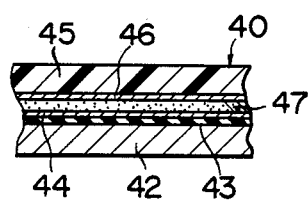
FIG. 4 is an enlarged, cross sectional view of part of a film-like solar cell received in the calculator of FIG. 1.

As illustrated in FIG. 4, the solar cell 40 comprises a metal substrate 42, an insulation film 43 formed on the substrate 42, an electrode 44 formed on the insulation film 43, a transparent layer (epoxy resin) 45 positioned above the electrode 44, a transparent electrode 46 formed on the lower surface of the layer 45 and amorphous silicon 47 sandwiched between the electrodes 44 and 46. The solar cell 40 is approximately 200 microns (0.2 mm) thick.

The upper surface of the polarization layer 35A is bonded to the lower surface of the display section region of the front film 13 with a transparent adhesive 60. The upper surface of the solar cell 40 is also bonded to the solar cell region 4 of the front film 13 with a transparent adhesive 60.

The front sheet 12 and back sheet 14 have substantially the same shape and size as those of the frame 11. The sheets 12 and 13 are made of metal (e.g., stainless steel) and about 100 microns thick. The front sheet 12 has openings 121 which are vertically aligned with the openings 51 of the spacer 50, an opening 122 in which the upper portion of the LC display cell 30 is placed, and openings 123 in which the solar cell 40 is placed. A recess 124 and recesses 125 are made by etching the lower surface of the front sheet 12. The recess 124 receives that portion of the LSI chip 23 which upwardly protrudes from the spacer 50. The recesses 125 receive those portions of the electronic elements 24 which upwardly protrude from the spacer 50. The LSI chip 23 and elements 24 are adhered to the front sheet 12 with the adhesive filled in the rececesses 125 and 123. The front film 13 and back film 15 are slightly larger than the front sheet 12 and back sheet 14. They are made of polyester synthetic resin and about 70 microns thick. The front film 13 is laminated to the upper surface of the front sheet 12. Similarly the back film 15 is laminated to the lower surface of the back sheet 14.

A mask is printed on the lower surface of the front film 13, except for the display section 2 and solar cell section 4. Further, numerals and symbols are printed on the individual key regions 3A of the front film 13. As mentioned above, the front sheet 12 and front film 13 form the front panel 1A. The front sheet 12 has openings vertically aligned with the key regions 3A, and the front film 13 covers these openings. Hence, the key regions 3A of the front film 13 may be elastically deformed when depressed.

The stationary contacts 25 are arranged below the front panel 1A and vertically aligned with the key regions 3A of the front film 13. Movable contacts 26 are adhered to the lower surfaces of the key regions 3A.

Therefore, when the user pushes any key region 3A with a finger, the movable contact 26 comes into contact with the corresponding stationary contact 25. Each movable contact 26 is made up of a two-side adhesive tape strip 27 of a predetermined size and a carbon film 28 of the same size bonded to the lower surface of the strip 26. The upper surface of the strip 26 is adhered to the front film 13 with an adhesive 27A.

As illustrated in FIG. 3, a filler 16 is used to secure the printed circuit board 20, LSI chip 23, electronic elements 24, LC display cell 30, solar cell 40, etc. The filler 16 has been formed by dribbling or depositing an adhesive with some flowability (e.g., a two-part adhesive made of an acrylic resin or an epoxy regin) into the casing 1 and subsequently hardening it. The back panel 1B is pressed against the adhesive before the adhesive completely hardens. The filler 16 also covers the outer periphery of the frame 11, as it is deposited thereon and subsequently hardens. Thus the back panel 1B is adhered to the front panel 1A through the portion of the filler 16 on the outer periphery of the frame 11. The portion of filler 16 outside of the frame 11 and the outer peripheries of the front film 13 and back film 15 are cut or trimmed, thus forming a smooth periphery of the casing 1.

As described above, the front panel 1A comprised of the front sheet 12 and front film 13 is adhered to the upper surface of the frame 11, the printed circuit board 20, film-like LC display cell 30, film-like solar cell 40, etc., which are arranged within the frame 11, are adhered to the lower surface of the front panel 1A, the filler 16 secures these members, and the back panel 1B made of the back sheet 14 and back film 15 is pressed against the filler 16 before the filler 16 completely hardens. Thus, the card calculator according to the present invention has a laminated structure, comprising thin film-like parts laid one upon another. The calculator is approxiomately 0.8 mm thick.

A method of manufacturing a small electronic device, according to the invention, will be described.

Figure 5:
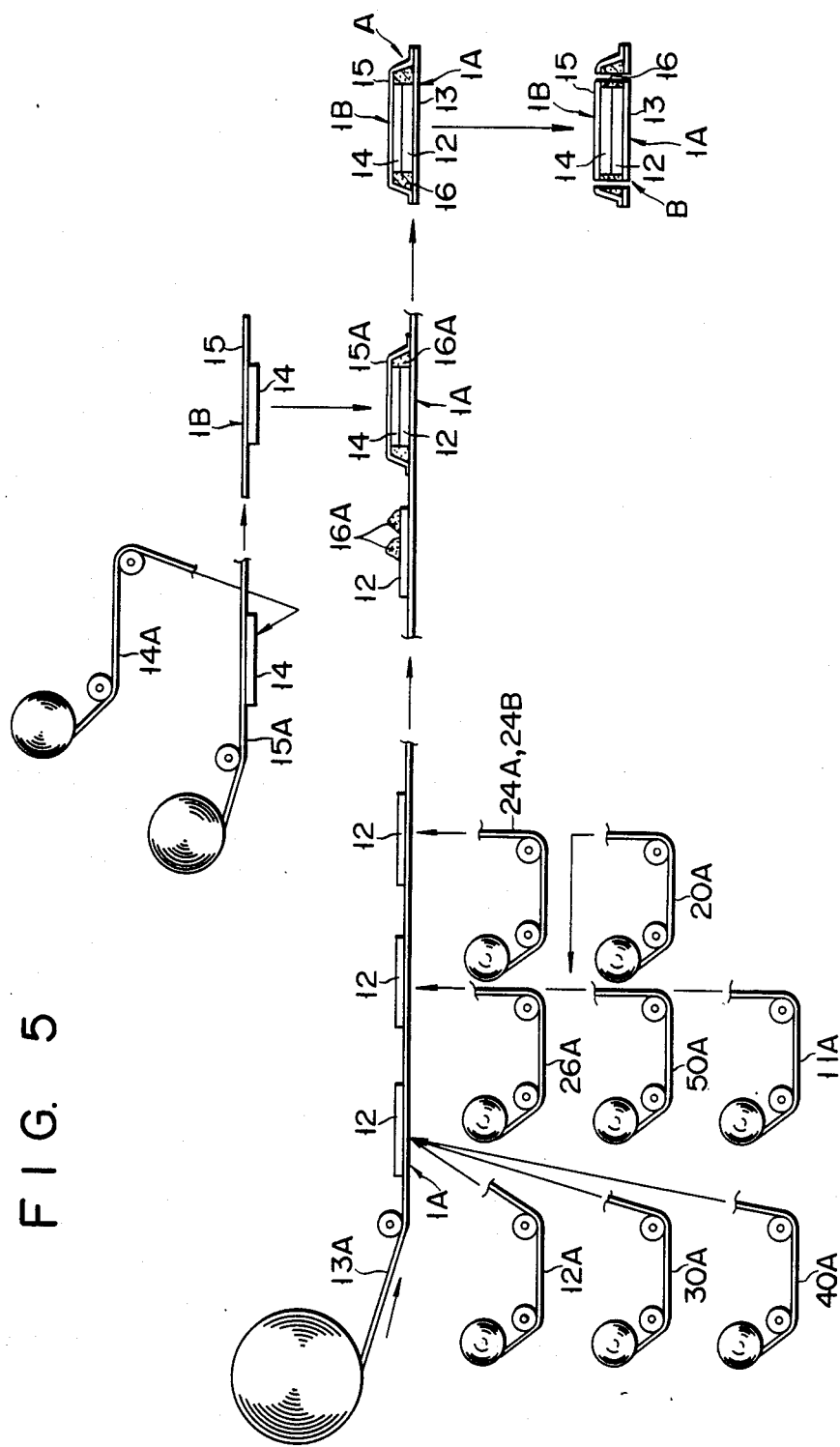
FIG. 5 illustrates the steps of a method of manufacturing a card calculator of one embodiment, according to the present invention.

FIG. 5 schematically illustrates how to manufacture a small electronic device by the method of this invention. A base film 13A, which will be ultimately cut to form front films 13, is intermittently fed out of a roll. As the base film 13A is thus fed forward, a front sheet 12 is laid on each predetermined length of the film 13A, thus forming a front panel 1B. Thereafter, a spacer 50, a printed circuit board 20, a film-like LC display cell 30, a film-like solar cell 40, etc. are bonded to the inner surface of the front panel 1A. Adhesive 16A is allowed to drop onto the inner surface of the front panel 1A. In the meantime, a film 15A, which will be ultimately cut to form back films 15, is fed out of a roll. As this film 15A is gradually fed forward, a back sheet 14 which has been cut from a long layer 14A is adhered to the inner surface of each predetermined length of the film 15A, thus forming a back panel 1B. The back panel 1B is laid on the front panel 1A and bonded thereto, thereby providing a laminated structure. This structure is heated and dried at the hardening point of the adhesive 16A. When the adhesive 16A fully hardens, the panels 1A and 1B are firmly fastened to each other. The filler 16 is deposited also on the periphery of the frame 11 and forms a layer when it hardens. This layer and the peripheral portions of the front panel 1A and back panel 1B are trimmed, whereby a card calculator is manufactured.

Figure 6:
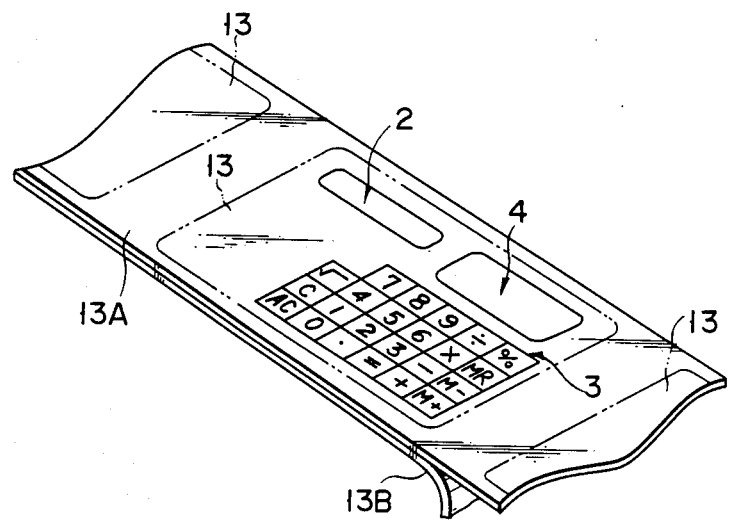
FIG. 6 is a perspective view of a base film with such a front film as shown in FIGS. 2 and 3.

The method will now be explained in greater detail. FIG. 6 shows the base film 13A. The base film 13A is slightly broader than the front film 13 having a display section 2, a keyboard section 3 and solar cell section 4, wherein each section is formed on the lower surface of the base film 13A. The base film 13A will be cut along the two-dot line with a laser beam, thus providing a front film 13. A transparent adhesive 60 is coated on the effective area of the lower surface of the base film 13A, which is defined by the two-dot line, except for the regions wherein movable contacts will be arranged. The adhesive coated surface of the base film 13A is covered by a separator 13B. The base film 13A is taken out of a roll and fed along an assembly line with that surface turned up which is coated with the transparent adhesive 60.

Figure 7:
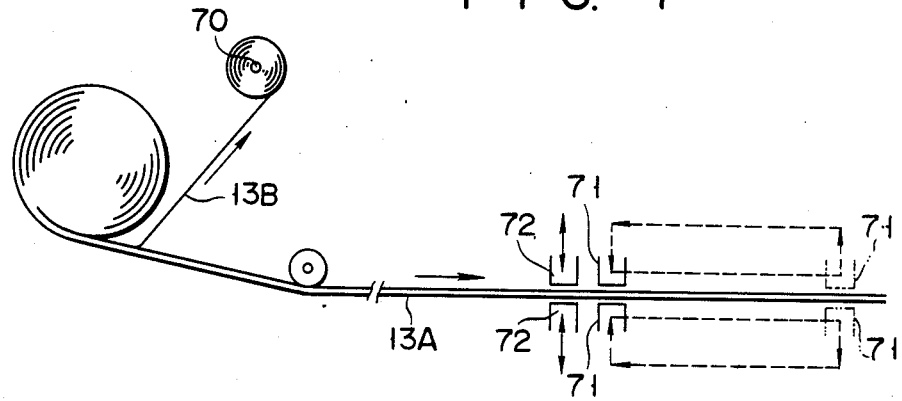
FIG. 7 shows the step of feeding the base film shown in FIG. 6.

FIG. 7 illustrates a plurality of film-feeding units 71 installed at optional points along the assembly line and one grip unit 72 positioned upstream of the film-feeding units 71. Each unit 71 comprises an upper grip and a lower grip. Similarly, the grip unit 72 comprises an upper grip and lower grip. The separator 13B is peeled off the base film 13A as it is pulled and taken up by a shaft 70, before the base film 13A reaches the grip unit 72. The grips of each film-feeding unit 71 can move up and down as indicated by arrows. They pinch the base film 13A, move horizontally for a predetermined distance, thus feeding the base film 13A for this distance, release the base film 13A, and finally move backward to the initial position, as shown by the broken line in FIG. 7. The units 71 repeat this sequence of motions, thereby intermittently feeding the film 13A, each time, for said distance. The grip unit 72 is immovable. It pinches the base film 13A when the film feeding units 71 don't pinch the base film 13A; it releases the base film 13A when the units 71 pinch the base film 13. Hence, the grip unit 72 prevents the base film 13A from slipping out of the stop position. The units 71 and 72 are so positioned as to pinch those portions of the base film 13A which are not coated with the adhesive 60, i.e., the portions between the effective areas of any two adjacent predetermined lengths of the base film 13A. Therefore, the upper grip of any unit 71 or 72 would not pull up the base film 13A when it leaves the base film 13A.

As the base film 13A is intermittently fed forward by the units 71, with its surface turned up which is coated with the adhesvie 60, a front sheet 12, a film-like LC display cell 30 and a film-like solar cell 40 are simultaneously bonded to the upper surface of the base film 13A.

Figure 8:
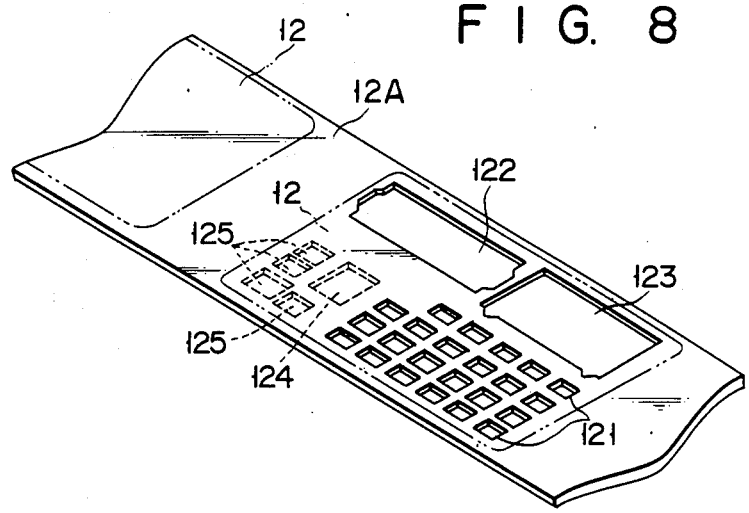
FIG. 8 is a persepective view of the metal sheet shown in FIG. 5, which is provided with such a front sheet as illustrated in FIGS. 2 and 3.

The front sheet 12 is prepared by punching out a long metal film 12A fed out of a roll (FIG. 5), along the two-dot line shown in FIG. 8. It is attracted to a vacuum suction means (not shown) and transported to, and put on, a positioning table 80 shown in FIG. 11.

Figure 9:
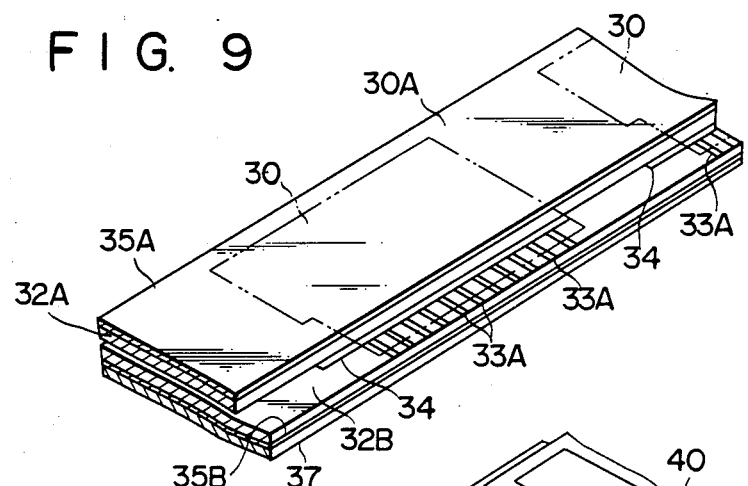
FIG. 9 is a perspective view of a display cell sheet provided with such a film-like LC (liquid crystal) display cell as illustrated in FIGS. 2 and 3.

The film-like LC display cells 30 are formed by punching a long LC display sheet 30A made of a plurarity of laminated layers, along the two-dot line shown in FIG. 9. The LC display sheet 30A comprises upper and lower base film 32A and 32B, upper and lower polarization plate 35A and 35B laid on the corresponding inner sides of the base film 32A and 32B, and a reflection plate 37 laid on the outer side of the lower polarization plate 35B. As shown in FIG. 5, this layer 30A is fed out of a roll. Each LC display cell 30 is attracted to a vacuum suction means (not shown) and transported to, and placed on, the positioning table 80 at a prescribed position.

Figure 10:
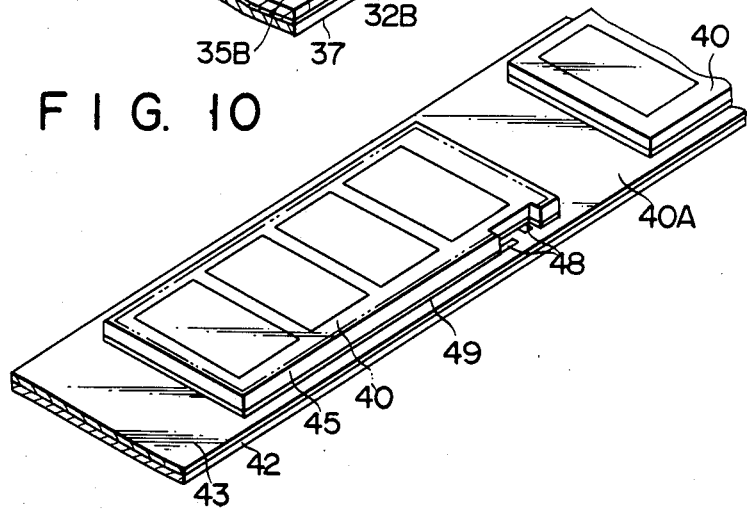
FIG. 10 is a perspective view of a solar cell sheet with such a film-like solar cell as shown in FIGS. 2 and 4.

The film-like solar cells 40 are formed by punching a long solar cell sheet 40A made of a pluarity of laminated layers, along a two-dot line shown in FIG. 10. The film-like solar cells 40 are equidistantly mounted on the solar cell sheet 40A which has been taken out of a roll. The cell sheet 40A consists of a metal base film 42 and an electrically insulating film 43 formed on the base film 42. Each solar cell 40 comprises an upper film 45, a seal element 49 existing at the periphery thereof and interposed between the upper film 45 and the metal base film 42, and a terminal section 49. Each solar cell 40 is also attracted to a vacuum suction jig, and transported to the positioning table 80 (FIG. 11), and temporarily mounted on the table 80.

Figure 11:
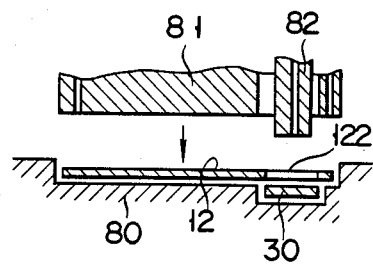
FIG. 11 is a cross sectional view of a positioning table for positioning a front sheet, the film-like LC display cell and the film-like solar cell, and a suction jig for securing these parts at desired positions.

As shown in FIG. 11, the front sheet 12, LC display cell 30 and solar cell 40 are placed on the positioning table 80, all with their reverse sides turned upward. The LC display cell 30 and solar cell 40 may be mounted on the table 80 in either of the following processes. First, these elements are put on the front sheet 12 and then inserted through the openings 122 and 123 thereof. Secondly, these elements are placed on the table 80 before the front sheet 12 is mounted on the table 80.

Figure 12:
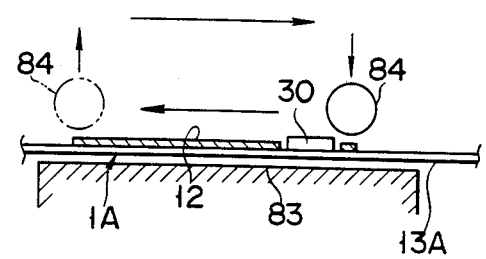
FIG. 12 shows how to adhere the front sheet, the film-like LC display cell and the film-like solar cell.

The front sheet 12, LC display cell 30 and solar cell 40 are attracted to a front sheet suction jig 81, a LC display cell suction jig 82 and a solar cell suction jig (not shown). These jigs move to a position above the base film 13A which is not moving. The front sheet 12, LC display cell 30 and solar cell 40 are released from the respective jigs and placed on the effective area of the front film 13 at prescribed positions. At the same time, they are bonded to the base film 13A with the adhesive 60 coated on the effective area of the front sheet 13. As shown in FIG. 12, a roller 84 is rolled on these elements put on the base film 13A which is in turn placed on a support table 83, thereby enhancing the bonding of the front sheet 12, LC display cell 30 and solar cell 40 to the base film 13A. The use of the roller 84 more firmly bonds not only said elements to the front film 13, but also the front sheet 12 to the base film 13A. The roller 84 is moved in the direction of the arrows, while rolling on the front sheet 12, LC display cell 30 and solar cell 40, and is thereafter lifted and returned to the initial position.

The front sheet 12 is bonded to the front film 13 in the above-mentioned manner, thereby forming a front panel 1A with the LC display cell 30 and solar cell 40 provided at the prescribed positions. The front panel 1A is transported further along the assembly line to a position, where film-like movable contacts 26, a spacer 50 and a printed circuit board 20 are attached to the front panel 1A.

As mentioned earlier, the film-like movable contacts 26 are made by punching a two-side adhesive film 27 with a carbon film 28 adhered to one side of the adhesive film 27. The movable contacts 26, the number of which is the same as that of the key regions 3A of the front film 13, are arranged on a film-like separator 85 so as to be vertically alinged with these key regions 3A, with the adhesive film 27 bonded to the separator 85 at the other side. The contacts 26 and separator 85 form a contact sheet 26A. The contact sheet 26 a is rolled and fed out of a roll when it is used. The movable contacts 26 are peeled from the separator 85, one by one, and are attached to the base film 13A.

Figure 13:
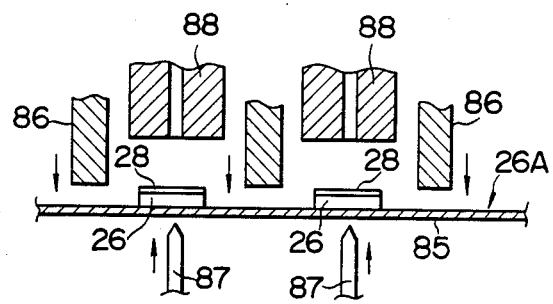
FIGS. 13 and 14 show how to peel film-like movable contacts from a contact sheet.
Figure 14:
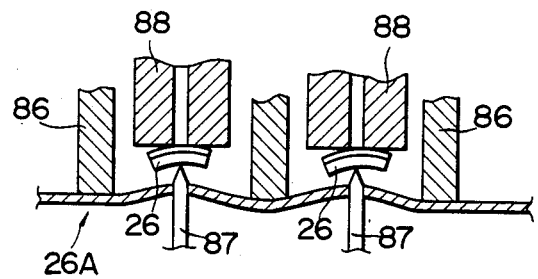

FIGS. 13 and 14 illustrate how the movable contacts 26 are peeled from the separator 85. Separator holders 86, contact push-up styluses 87 and suction jigs 88 are used to seprate the contacts 26 from the separator 85. The contact sheet 26A is stopped when the movable contacts 26 come to the positions right above the styluses 87 as shown in FIG. 13. Then, the separator holders 86 are lowered to come into contact with those portions of the separator 85 which correspond to the boundaries of the key regions 3A of the front film 13. At the same time, the styluses 87, the number of which is identical with that of the movable contacts 26, are moved upwardly until they pierce the separator 85 and peel the contacts 26 from the separator 85. The suction jigs 88, the number of which is also identical with that of contacts 26, are then lowered and attract the movable contacts 26 peeled from the separator 85. These jigs 88 with the contacts 26 attracted to them are moved to a position above the film 13A and vertically aligned with the key regions 3A of the front panel 1A. The jigs 88 are lowered until the contacts 25 are bonded to the front film 13 with adhesive 27A (FIG. 3).

The spacer 50 is made of a two-side adhesive film both surfaces of which is coated with an adhesive 61A and 61B as shown in FIG. 3. Many spacers 50 of this structure are sandwiched between two film-like separators 89A and 89B, thus forming a spacer sheet 50A. The spacer sheet 50A is taken up to form roll as shown in FIG. 5. From this roll, the sheet 50A is fed, with the reverse sides of the spacers 50 turned upward.

Figure 15:
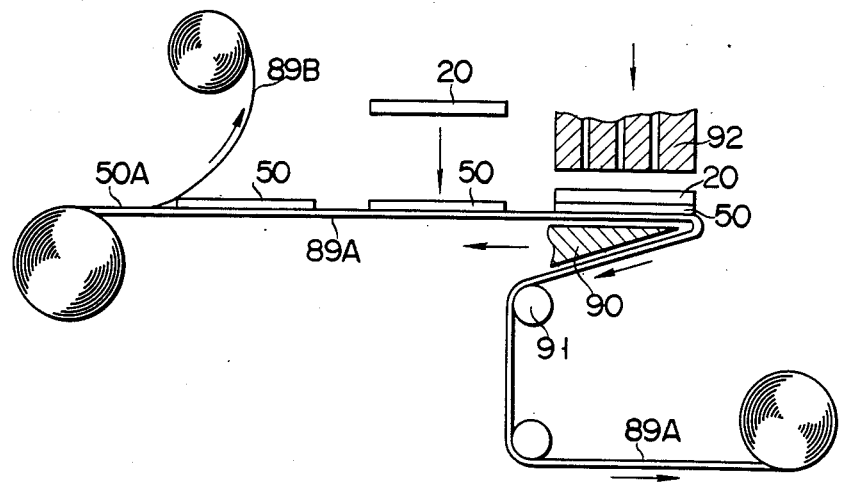
FIG. 15 illustates how to take out spacers from a spacer sheet.
Figure 16:
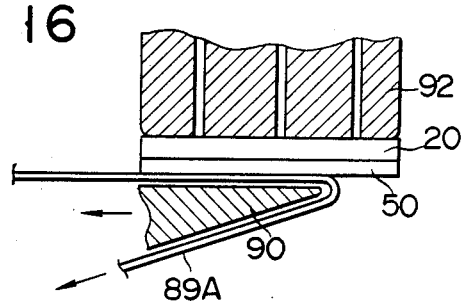
FIG. 16 is an enlaged view of a part for taking spacers from the spacer sheet.

As shown in FIG. 15, the upper separator 89B is peeled from the spacer sheet 50A fed from the roll, thereby exposing the reverse sides of the spacers 50. Printed circuit boards 20 are bonded to the reverse sides of the spacers 50. This done, the spacer sheet 50A is further fed to a position where the spacers 50 will be taken out. The lower separator 89A is turned around the edge of a movable table 90 and taken up. When each unit consisting of the spacer 50 and printed circuit board 20 reaches the edge of the movable table 90, the spacer sheet 50A is stopped. A vacuum suction jig 92 is lowered until it comes into contact with this unit. The jig 92 attracts the unit. Under this condition, the lower separator 89A is further taken up, thus moving the table 90 in the direction of arrow (FIG. 16). Then, the spacer 50 is peeled off the lower separator 89A.

This unit of the spacer 50 and printed circuit board 20 removed by the suction of the vacuum suction jig 92 is conveyed by the jig 92 to the effective portion of the front panel 1A on the base film 13A, where it is attached by the adhesive 61 on the spacer face to the front sheet 12 of front panel 1A.

Figure 17:
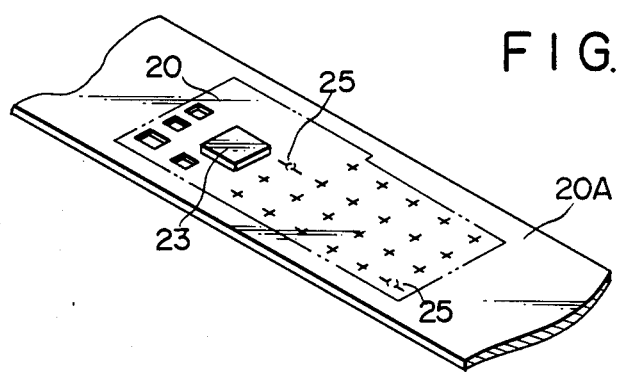
FIG. 17 is a perspective view of a board sheet with such a printed circuit board as illustrated in FIGS. 2 and 3.

As shown in FIG. 17, the printed circuit boards 20, on which a resin molded LSI chip 23 has been soldered to the wiring, are arranged at fixed intervals on a circuit board film 20A. Also, as shown in FIG. 5, this film 20A is pulled from a roll. Then, the boards 20 are punched from the film 20A along the two-dot lines showing the outline of the boards 20 in FIG. 17 and conveyed to the spacer sheet 50A by a vacuum suction jig (not shown) where each is positioned on the spacer 50 and adhered by the adhesive 61B on the spacer surface.

Figure 18:
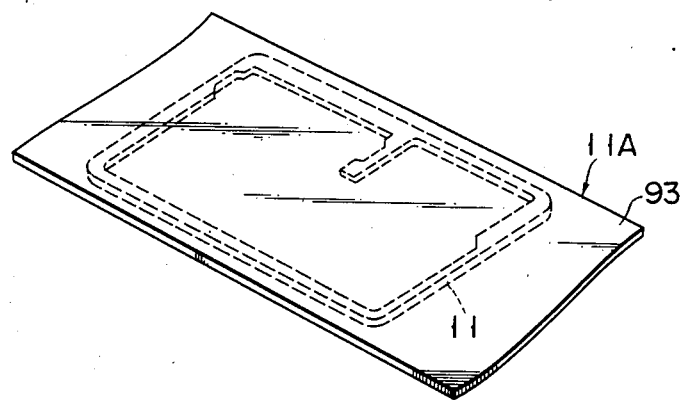
FIG. 18 is a perspective view of a frame sheet.

The surface of the frame 11 is coated with adhesive 62 (see FIG. 3) and, as shown in FIG. 18, a film-like separator 93 is attached to this surface. Many frames 11 are attached in fixed intervals to separator 93. This separator 93 having a plurality of frames 11 forms a frame sheet 11A. The frame sheet 11A is made into a roll, as is shown in FIG. 5.

The frames 11 are then sucked from the unrolled frame sheet 11A by the jig and the separator 93 is peeled from the frames 11, for example, the same way that separator 89A is peeled from spacer 50. The frames 11 are conveyed to the base film 13A where they are positioned on front sheet 12 and fastened by adhesive 62 which is on the surface of the frames 11.

The movable contacts 26, the unit of the spacer 50 and printed circuit board 20, and frame 11 may be adhered in any order.

The base film 13A, which includes the movable contact 26, the unit of the spacer 50 and printed circuit board 20 and the frame 11, is moved to the next position for the inclusion of parts and stopped. At this position, chip elements 24 such as diodes and capacitors are added.

These chip elements 24 are attached at a number of fixed intervals on a chip sheet having a base film, and are punched out from this chip sheet.

Figure 19:
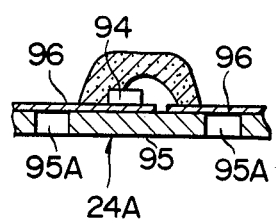
FIG. 19 is a cross sectional view of a chip sheet with a diode mounted on it.

FIG. 19 shows a chip sheet 24A to which a diode is attached. Leads 96 are formed on base film 95 by coating copper foil on the upper surface of the film and etching it. Diode 94 is directly attached to one of the leads of the base film 95 in which through holes 95A are formed in locations corresponding to the printed circuit board connection terminals of the lead. The other lead is connected by wire bonding and is sealed with plastic.

Figure 20:
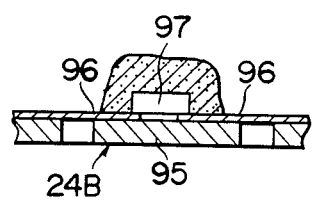
FIG. 20 is a cross sectional view of a chip sheet with a capacitor mounted on it.

FIG. 20 shows a chip 24B to which a capacitor (e.g. tantalum capacitor) is attached. Capacitor 97 is directly attached between the leads on the base film in substantially the same manner as the diode was attached, and is sealed with plastic.

Chip sheets 24A and 24B are also rolled up and the chips on the sheets are punched from the sheet, and then conveyed by the jig to the base film 13A and soldered to the printed circuit board 20.

Figure 21:
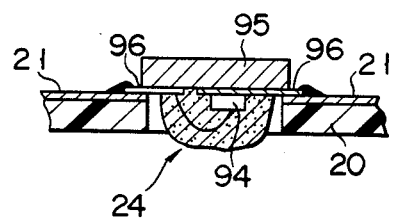
FIG. 21 is a cross sectional view of a circuit board and a chip with a diode embedded in the board.

FIG. 21 shows chip element 24, on which diode 94 is attached, integrated with printed circuit board 20. This chip element 24 is inserted into the through hole in the printed circuit board 20 and the leads 96 are soldered to the terminals of the wiring 21 of the board (the wiring on the lower side of the board in FIG. 3).

In the previous process, the LC display cell 30 and the solar cell sheet 40 which are integrated with film 13A, are connected to the printed circuit board by heat seal connectors 31, 41 shown in FIG. 2 after having been integrated with the board. This connection may be carried out in parallel with the integration of the chip 24 or before or after the chip 24 is integrated.

Figure 22D:
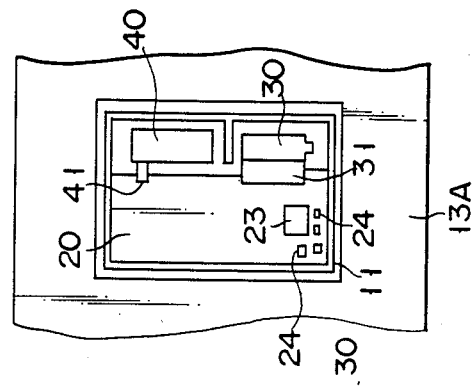
FIGS. 22A–22D are plan views of an unfinished product, illustrating how it is processed as it is moved along an assembly line.
Figure 22C:
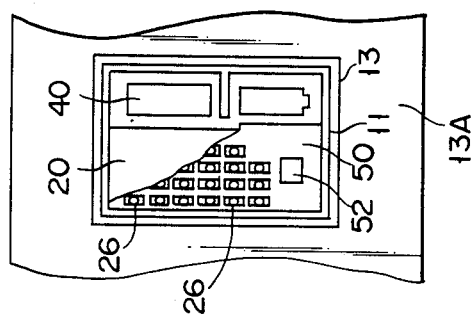
Figure 22B:
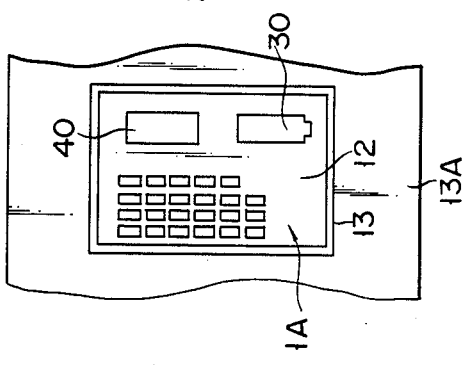
Figure 22A:
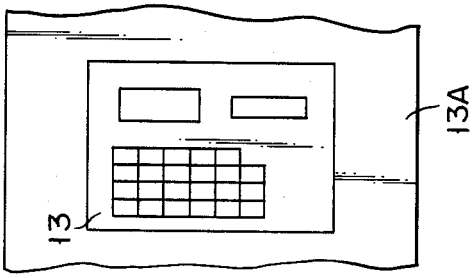

FIGS. 22A-22D are plan views of the parts as they are laid on the base film 13A, which is intermittently fed along the assembly line in the process described up to now. FIG. 22A shows the base film 13A before any parts are laid on it, FIG. 22B shows front sheet 12 laminated to the base film 13A to form the desired portion of the front panel 1A together with LC display panel 30 and solar cell 40, FIG. 22C shows the movable contacts 26, spacer 50, printed circuit board 20 and frame 11 respectively laid on the base film 13A, and FIG. 22D shows the board, LC display panel and solar cell connected together by heat seal connectors 31, 41.

After all the electronic parts have been embedded, the assembly is inspected and, then, while intermittently feeding the base film 13A as shown in FIG. 5, the part of front panel 1A is filled with drops of adhesive 16A, which becomes filler 16. After back panel 1B has been formed by laminating back sheet 14 and back film 15, it is pressed onto this structure. Next, this laminated structure is heated and dried so that adhesive 16A, which acts as filler 16, hardens to bond the front and back panels.

Figure 24A:
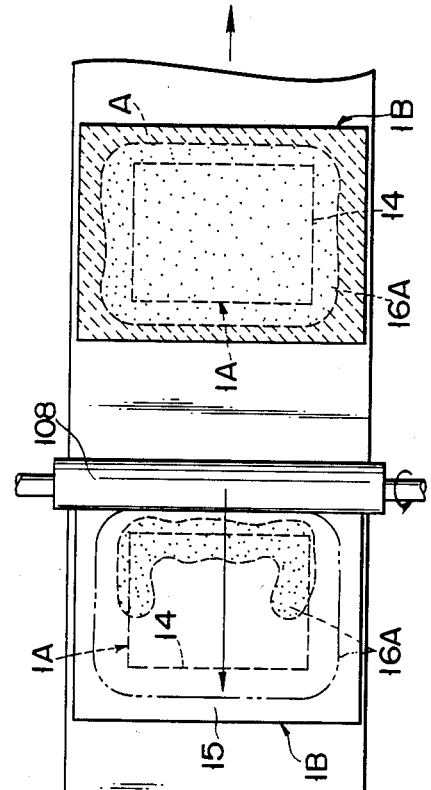
FIGS. 24A–24D are plan views of the base film, illustrating how the adhesive is deposited onto the base film and how a back panel is pressed onto the base film.

FIGS. 23A-23D and 24A-24D show the processes from when the adhesive 16A is added to when the back panel 1B is laid on the structure. As shown in FIGS. 23A and 24A, the adhesive 16A is added, in drops, to the desired locations on the front panel 1A toward the front, in the direction of travel, along the side edge, and in the center, at suitable intervals.

Adhesive 16A is a separate adhesive agent/curing agent type. The adhesive agent and curing agent are supplied separately to mixer 100, mixed and stored in the mixer 100. A specified amount of adhesive, e.g., enough for one day's use, is stored in the mixer 100. A push screw (not shown) is provided on the mixer 100 pressing out the adhesive 16A at the desired locations through distributer 101 and a plurality of nozzles 102. Valve 103 opens for a specified time so that a similar amount of adhesive is dropped onto parts of front panel 1A from the nozzles 102 at the same time.

Figure 24B:
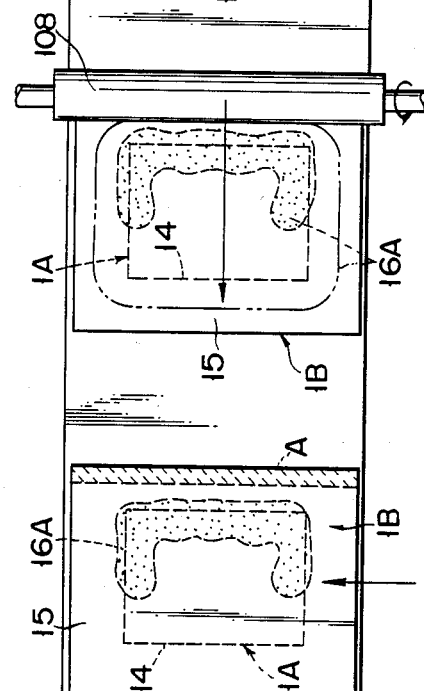

From this stage the front panel 1A moves to the next stage shown in FIGS. 23B and 24B, where the back panel 1B is laid on the adhesive 16A.

As shown in FIG. 5, after a plastic film 15A, which has adhesive 63 (shown in FIG. 3) coated on the rolled up surface, is pulled from the roll and laminated with back sheet 14 to form back panel 1B, the plastic film 15A is cut slightly larger than the outside of the products. The back sheet 14 is formed by punching the back sheet shape from a roll of metal sheet 14A. This back sheet 14 is then laid on plastic film 15A by a vacuum suction jig (not shown) and is laminated by a rotating pressure roller. The adhesive side of the plastic film 15A is protected by a separator, which is peeled from the back sheet 14 in advance.

Back panel 1B formed of back film 15, which is cut from the plastic film 15A, and back sheet 14, which is laminated onto the back film 15, is placed on a turntable (not shown) and, after being rotated, is conveyed onto the base film 13A with the front surface of back sheet 14 down by conveyance jig 104, as is shown in FIG. 23B, and laid on adhesive 16 on front panel 1A.

Conveyance jig 104 is comprised of vacuum suction jig 106, which is supported on the bottom of elevator 105, which moves straight up and down. This vacuum suction jig 106 angles downward from the bottom surface of the elevator 105 as shown in FIG. 23B using a certain drive mechanism (not shown). Pressing means 107 is for pressing one end edge of back film 15 of the back panel 1B (the front edge in the direction of travel) against the base film 13A to position and attach it by the adhesive coated on the lower side of the end edge of the back film 15.

The laminating of back panel 1B to part of front panel 1A of the base film 13A is carried out as follows.

First, the back panel 1B, which has been held against the lower side of vacuum suction jig 106 and conveyed (during conveyance the suction jig 106 is flat against the elevator), faces the front panel 1A on the base film 13A and by rotating the pressing means 107 downward as shown in FIG. 23B it is picked up and placed as shown. The one end edge of back sheet 14 of the back panel 1B and of front sheet 12 of the front panel 1A (front end edge in direction of travel) is aligned and, then, alignment pressing means 107 adheres the one end edge of back film 15 against the base film 13A and one end edge of the back panel 1B is aligned correctly in relation to the front panel. In FIG. 24B, the region A indicates the adhesive portion between the base film 13A and the back film 15. Then, elevator 105 is lowered to lower vacuum suction jig 106 onto the front panel 1A so that the back panel 1B is lowered on to the front panel 1A. The back panel 1B is laid on top of the front panel 1A starting with the one end edge and progressing forward, and is pressed by elevator 105 via the jig 106. Then, when pressed, the adhesive 16A on the front panel 1A spreads out around the periphery to cover one side and parts of both ends between the front and back panels, as shown in FIG. 24B.

The reason for laying the back panel 1B on the front panel 1A in the manner stated and starting at one end edge and progressing forward is to press as little of the air between the panels as possible. After the back panel 1B has been laid down, conveyance jig 104 stops its suction and rises, and moves onto the turntable until the next back panel 1B is conveyed.

The adhering of the two panels, s carried out by a pressure means e.g. a pressure roller 108, which rotates in the direction of travel synchronous with travelling speed due to the action of the drive mechanism (not shown), and is started at one end and progresses to the other end while maintaining a constant level. By pressing the two panels 1A and 1B, the adhesive between them is spread from one end to the other end, forcing out the air.

Figure 24C:
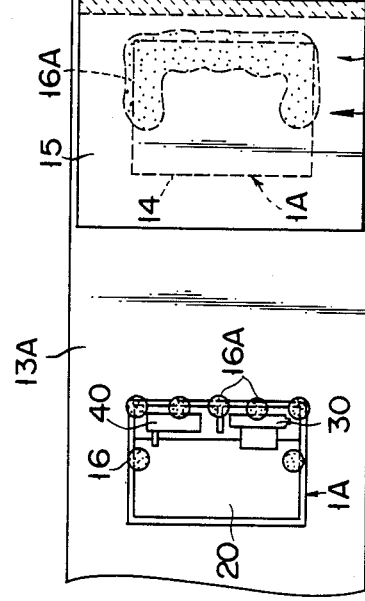

With these processes it is possible to force out the air between the panels 1A and 1B and spread the adhesive over the whole area, as is shown by the dotted lines in FIG. 24C. This process of pressing also prevents wrinkling and buckling due to the pressure on the surface of the back panel 1B, which would result if the back panel 1B was pressed from one end to the other end.

Figure 24D:
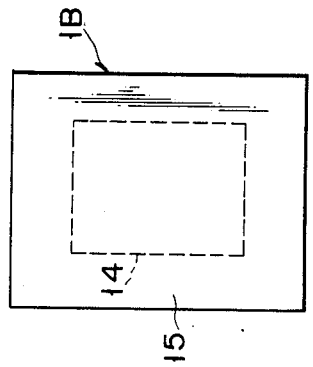

Then, as shown in FIGS. 23D and 24D, the periphery of the back film 15 of the back panel 1B is pressed against film 13A by a frame-like pressure jig 109 and the entire periphery is adhered by adhesive 63 coated on the lowerside of the back film 15. Adhesive 16A, which is filled around the outside of frame 11 (see FIG. 3), is prevented from spreading out any farther. After this, the structure is heated and dried to harden the adhesive 16A.

After the front and back panels 1A and 1B have been bonded, the peripheral edge of back film 15 and the base film 13A are cut together at a position slightly to the inside of the peripheral edge of the back film 15, and, the front film 13 is cut from the base film 13A to obtain the semifinished product A shown in FIG. 5. Next, the peripheries of front film 13 and back film 15 are finish cut together with the periphery of filler 16 by a laser beam to produce the final product B.

Figure 25:
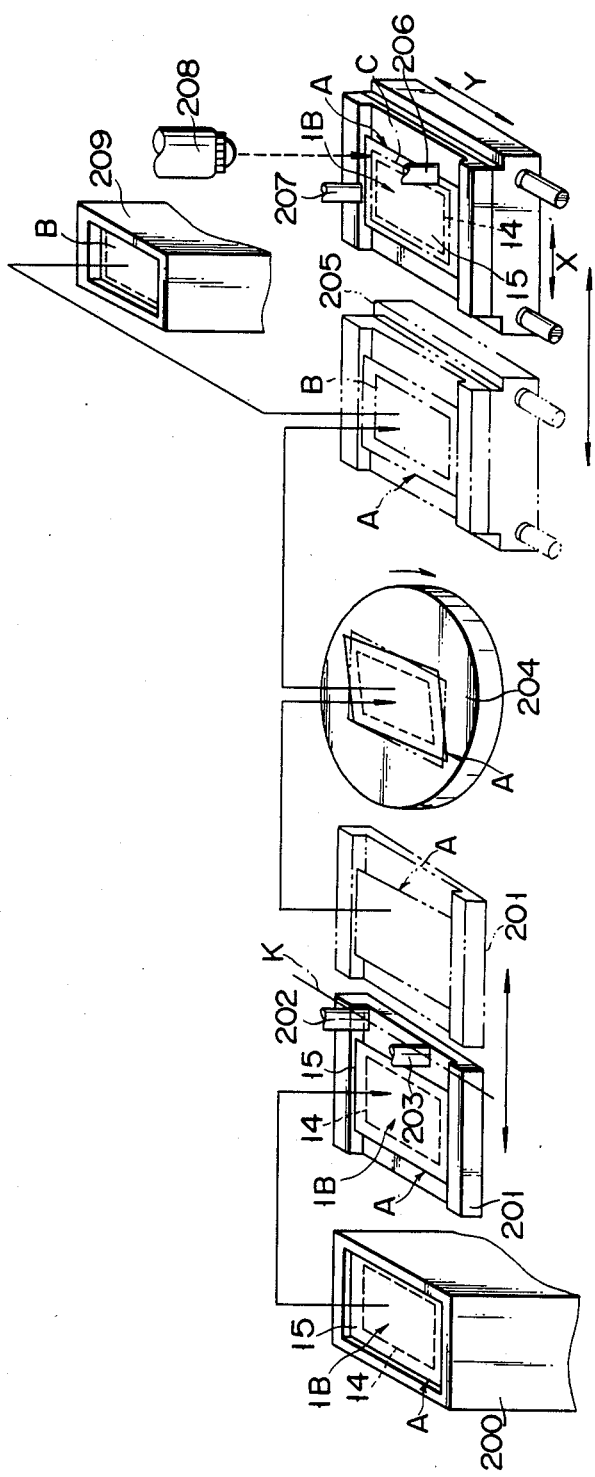
FIG. 25 is a perspective view of an unfinished product, explaining how the product is trimmed into a finished product.

FIG. 25 shows the processes of finish cutting in which the semifinished products A are piled up and stored in box 200 and are placed one by one on transfer table 201, which moves back and forth between the position shown by the solid lines and the position shown by the two-dots lines, by a vacuum suction jig such that the back panel 1B faces up. A pair of magnetic sensors 202, 203 is provided above the path of the transfer table 201 so as to face the upper surface of the semifinished product on the table 201 at a close distance. The sensors 202, 203 are arranged by the reference line K which is perpendicular to the direction of travel of the table 201 and are used for detecting the direction of the back sheet 14 under the back film 15. When the side edge of the back sheet 14, which is made of metal, passes under the sensors 202, 203, misalignment of the side edge in relation to reference K is detected. FIG. 26A is a plan view of a misaligned product. The centers of the magnetic sensors and indicated at 202A and 203A. Detection of the direction of the back sheet 14 does not mean the detection of the side edge of the semifinished product; namely, the side edge of the back film 15 but rather the detection of the back sheet 14 itself. As the back film 15 is cut too large from plastic film 15A, the side edge of the back film 15 is not always parallel with the side edge of the back sheet 14.

After the semifinished product A of which the direction of the back sheet 14 has been detected has been moved to the position shown by the two-dot lines, it is removed from the transfer table 201 by a vacuum suction jig and, maintaining the direction it had on the table 201, it is placed on turntable 204. This turntable 204 adjusts the direction of the product A such that the side edge of the back sheet 14 faces in the desired direction by rotating only by the amount that the side edge is misaligned in relation to reference line K. FIG. 26B is a plan view showing the product A before being corrected.

Finish-cutting table 205 moves back and forth between the position shown by solid lines and the position shown by two-dot lines, where the product A is cut by a laser. The finish-cutting table 205 is capable of moving back and forth, and left and right. After the position-adjusted product A is placed on the finishcutting table 205 by a vacuum suction jig, it moves from a pick-up position to a cutting position as the finish-cutting table 205 is moved.

A pair of magnetic sensors 206, 207 for detecting the side edge and the end edge of the back sheet 14 made of the metal are located above the cutting position facing, and near to, the upper surface of the product A. Laser 208 is located slightly outside (0.1 to 0.3 mm) and above the intersection of the line along one side edge on which sensor 206 is located and the line along one end edge on which sensor 207 is located. FIG. 26C shows the positional relationship in a plan view of the semifinished product on finish-cutting table 205 to the pair of magnetic sensors 206 and 207 and the laser 208. The centers of the sensors 206 and 207 are indicated at 206A and 207A.

When the finish-cutting table 205 is moved in either the X and/or Y direction, as shown in FIGS. 25 and 26C, for example, in the case of the X direction one side edge of back sheet 14 made of a stainless is detected by sensor 206, the table 205 stops in the X direction. Next, the table 205 is moved in the Y direction and, when sensor 207 detects the one end edge of the back sheet 14, the table 205 is stopped in that direction.

In this way, by aligning the edge and side of the back sheet 14 with the centers of the sensors 206 and 207, laser 208 is located slightly to the outside of one corner of the back sheet 14 (directly above corner C of the outline of the product). While a laser beam is radiated onto the product, the table 205 describes a rectangle (outline C shown by a one-dot line in the FIGS. 25 and 26C) moving forward, backward, left and right by the exact length and width of the product thereby cutting the external periphery of back film 15 and front film 13 and the filler 16 to produce the finished product B. The movement of the table is stored beforehand in the table's control device.

After the product has been returned to the pick-up location after cutting, the vacuum suction jig conveys it to box 209, shown in FIG. 25, where it is kept.

With these processes it is possible to accurately position the semifinished product for cutting by the laser 208, resulting in a high quality product in which the filler 16, which forms the periphery of the frame 11, has great uniformity.

In the above embodiment, the back sheet 14 was made of metal and its edges were detected by magnetic sensors 206 and 207. However, it is possible for the frame 11 to be made of metal and not the back sheet 14. Also, instead of either the frame 11 or the back sheet 14 being made of metal, if the front sheet 12 is made of metal, its periphery can be detected from the opposite side by the sensors 206 and 207, and then cut. In other words, it is necessary for only one of the three—back sheet, front sheet or frame—to be made of metal.

Magnetic sensors for detecting metal were used in this embodiment but, a capacitance type proximity sensor, which detects a difference in relative dielectric constant, or a reed switch, in which the contacts are opened by changes in the magnetic field which occur when a metal body passes between a pair of contacts formed of a permanent magnet and soft magnetic material, may also be used. If the back sheet 14 of the back panel 1B is made of metal and the back film 15 of transparent material, it is possible to detect the light reflected from the back sheet using a photosensor.

Figure 27:
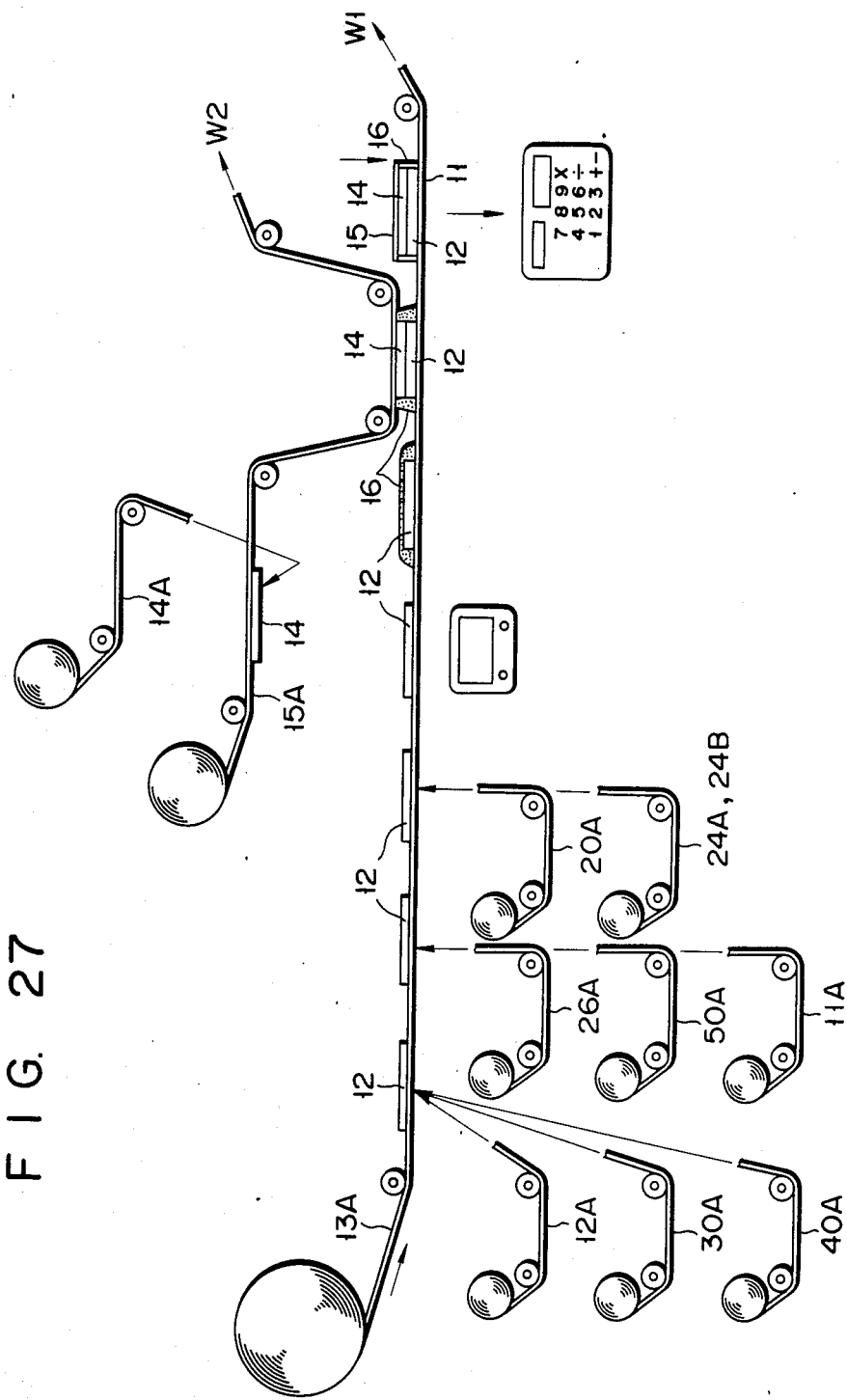
FIG. 27 illustrates steps of a method of manufacturing a card calculator of a modified embodiment, according to the present invention.

FIG. 27 illustrates steps of the method of manufacturing a card calculator of a modified embodiment, according to the present invention. A back film 15A, on which back sheets 14 are mounted, is laid on a base film 13A with electronic elements mounted on it. The back film 15A is pressed onto the base film 13A, so that the back sheets 14, base film 13A and electronic elements are put together, forming a laminate with each back sheet 14 in contact with the electronic elements. A laser beam is applied onto this laminate, thereby cutting from it finished products (i.e., rectangular card calculators). Thereafter, the back film 15A minus the back film strips 15, i.e., a film having rectangular holes, is taken up by a film take-up device (not shown) in the direction of arrow W2. Hence, it is unnecessary to cut the back film 15A into strips. Similarly, the base film 13A minus these products, a film having rectangular holes, is taken up by a film take-up device in the direction of arrow W1.

Figure 28:
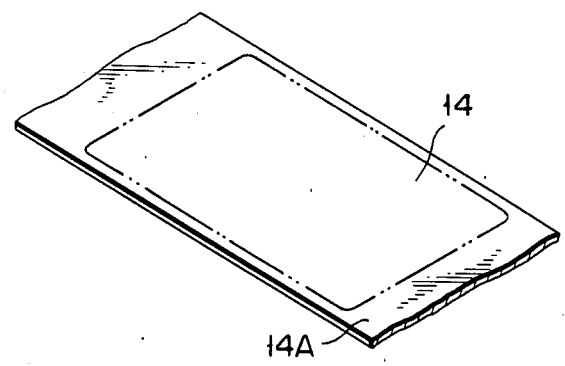
FIG. 28 is a perspective view of a metal film.
Figure 29:
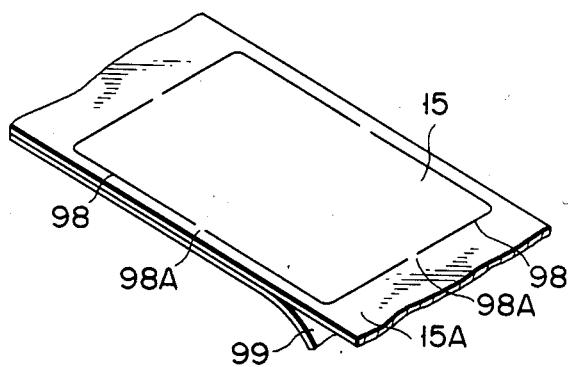
FIG. 29 is a perspective view of a synthetic resin film.

FIG. 28 shows a metal film 14A from which each back sheet 14 will be cut. FIG. 29 shows a synthetic resin film 15A from which each back film strip 15 will be cut. To form each back sheet 14A, the metal film 14 is fed from a roll (FIG. 5) and is cut with a laser beam along the two-dot line shown in FIG. 28. Similarly, to form each back film strip 15, the synthetic resin film 15A is fed out of a roll (FIG. 5). As shown in FIG. 29, four curved slits 98 are made in the film 15A, defining a rectangle which is a little larger than the profile of the product i.e., a card calculator. Those portions 98A of the film 15A, which exist among the slits 98, are left uncut. An adhesive is coated on that surface of the film 15A on which the back sheets 14 will be mounted. This surface is covered by a film-like separator 99.

In this embodiment, laminating the back sheet 14 and the back film 15 is done by pressing both panels 1A and 1B, and the products are made without forming semifinished products.

In the above embodiment, the back panel 1B consists of the back sheet 14 and the back film 15. Alternatively, the back panel 1B may be constructed by only the back sheet 14.

The method of manufacture of this invention is not restricted to small electronic calculators but may be applied to any small electronic device.

What is claimed is:

1. A method of manufacturing a small electronic device, comprising the steps of:
   providing a first panel having predetermined surface area;
   providing a second panel having a surface area substantially the same as that of the first panel and a cavity of predetermined area and thickness;
   providing an electronic part assembly including at least one film-like printed circuit board and at least one integrated circuit chip, said electronic part assembly having an area and thickness which enable it to be disposed in said cavity;
   providing a third panel having an area substantially the same as that of the first panel, and a flat outer surface; and
   attaching said first, second and third panels to one another thereby disposing said electronic part assembly in said cavity and securing same between said first and said second panels.

2. A method according to claim 1, including providing a thin metal plate having at least one recess at its inner surface facing said electronic part assembly, as said first panel.

3. A method according to claim 2, including forming said thin metal plate as a front portion of the small electronic device.

4. A method according to claim 1, including providing a thin metal plate as said third panel.

5. A method according to claim 1, including strip-like flexible films as said first and third panels; and cutting said strip-like flexible films after the step of attaching the panels, thereby forming a periphery of a finished product.

6. A method of manufacturing a small electronic device, comprising the steps of:
   providing a first panel having a predetermined surface area including a flexible film which is formed with key indicia;
   providing an electronic part assembly including at least a film-like printed circuit board, in which wiring including at least key contacts is provided, and an integrated circuit chip, each contact of said chip being connected to said wiring;
   providing a second panel having an inner surface portion which stores said electronic part assembly, and a flat outer surface opposed to said inner surface and having substantially the same surface area as that of said first panel; and
   attaching (a) said first panel and said electronic part assembly to one another with said key indicia of said first panel and said key contacts of said electronic part assembly in opposing relation, and (b) said electronic part assembly and said second panel to one another.

7. A method according to claim 6, including providing a thin metal plate which has at least one recess at its inner surface as said first panel, and facing said recess toward said integrated circuit chip.

8. A method according to claim 7, including providing an opening in a part of said thin metal plate opposing said key contacts of the electronic part assembly.

9. A method according to claim 6, including providing a film-like liquid crystal device and a film-like power battery as said electronic part assembly.

10. A method according to claim 9, including providing a flexible film having a window portion as said first panel, and arranging the window portion to oppose said film-like liquid crystal device.

11. A method according to claim 6, including providing a strip-like flexible film for each of said first and second panels, and cutting said strip-like flexible films after the step of attaching said first and second panels to said electronic part assembly, thereby forming a periphery of a finished product.

12. A method according to claim 11, including providing a thin metal plate for at least one of said first and second panels, and the step of cutting said strip-like flexible films includes cutting the peripheries of both flexible films of said first and said second panels.

13. A method according to claim 11, including arranging a frame between said first and said second panels and attaching the frame at its periphery to one of said first and said second panels, and forming the frame with a cavity for storing said electronic part assembly; and the step of cutting said strip-like flexible films is performed along the periphery of said frame.

14. A method of manufacturing a small electronic device, comprising the steps of:
providing a first film, coating a first adhesive layer on a lower surface of said first film and sticking a peelable separator to said first adhesive layer;
peeling said separator from said first adhesive layer to expose the first adhesive layer;
attaching a sheet to the exposed first adhesive layer to form a first panel;
forming certain wiring on a printed circuit board and attaching an integrated circuit chip to the printed circuit board, thereby providing an electronic part assembly;
providing a second panel and arranging the inner surface thereof in opposing relation to that of said first panel, the second panel having a flat outer surface;
forming a second adhesive layer between one of said first and said second panel, and said electronic part assembly; and
joining said electronic part assembly to said first and second panels by pressing such that said electronic part assembly is located between said first and said second panels.

15. A method of manufacturing a small electronic device, wherein first and second film-like members each having a predetermined surface area are provided, at least one thin electronic part having a surface area smaller than that of the first and second members is mounted between the first and second members, and the outer periphery of each of said first and second members is cut to obtain an electronic device having a desired shape, comprising the steps of:
attaching said electronic part to said first member;
forming an adhesive layer on said first member to which said electronic part is attached;
disposing said second member onto the adhesive layer of the first member;
pressing an upper surface of said second member toward said first member by pressing means movable from one end to the other end of said second member;
elongating said adhesive layer to a trim cut surface region; and
cutting said first and second members together with said adhesive layer after fully elongating said adhesive layer.

16. A method of manufacturing a small electronic device, comprising the steps of:
preparing a semifinished product by making a casing comprising two pieces of plastic film having a surface area longer than that of said casing, an electronic part, and a metal panel interposed between and attached to said two pieces of plastic film to store said electronic part;
detecting the position of an edge of said panel; and
applying a laser beam to a predetermined portion of said semifinished product to cut at least side edges of said pieces of plastic film.

* * * * *